US011503717B2

(12) United States Patent
Gonsher et al.

(10) Patent No.: US 11,503,717 B2
(45) Date of Patent: Nov. 15, 2022

(54) HIGH SPEED MULTI-DIRECTIONAL THREE DIMENSIONAL PRINTER

(71) Applicant: Brown University, Providence, RI (US)

(72) Inventors: Ian Gonsher, Arlington, MA (US); Justin Jae Chul Lee, Guilford, CT (US); Matthew Lo, Westwood, MA (US)

(73) Assignee: Brown University, Providence, RI (US)

( * ) Notice: Subject to any disclaimer, the term of this patent is extended or adjusted under 35 U.S.C. 154(b) by 255 days.

(21) Appl. No.: 17/014,070

(22) Filed: Sep. 8, 2020

(65) Prior Publication Data

US 2021/0076502 A1  Mar. 11, 2021

Related U.S. Application Data

(60) Provisional application No. 62/896,993, filed on Sep. 6, 2019.

(51) Int. Cl.
*H05K 3/12* (2006.01)
*H05K 1/02* (2006.01)
*H05K 3/34* (2006.01)
*B29C 64/25* (2017.01)
*B29C 64/393* (2017.01)
*B33Y 30/00* (2015.01)

(52) U.S. Cl.
CPC ........... *H05K 3/1216* (2013.01); *B29C 64/25* (2017.08); *B29C 64/393* (2017.08); *B33Y 30/00* (2014.12); *H05K 1/0269* (2013.01); *H05K 3/3485* (2020.08)

(58) Field of Classification Search
None
See application file for complete search history.

(56) References Cited

U.S. PATENT DOCUMENTS

| 2015/0140147 | A1* | 5/2015 | Konstantinos | ........ B29C 64/241 |
| | | | | 425/174 |
| 2015/0314527 | A1* | 11/2015 | Kline | .................... B29C 64/227 |
| | | | | 425/447 |
| 2016/0271871 | A1* | 9/2016 | Lee | ......................... B29C 48/02 |
| 2016/0332378 | A1* | 11/2016 | Page | ...................... B29C 64/118 |
| 2017/0144379 | A1* | 5/2017 | Sung | ...................... B33Y 30/00 |
| 2017/0232549 | A1* | 8/2017 | Lacaze | ................... B33Y 80/00 |
| | | | | 164/469 |
| 2017/0312980 | A1* | 11/2017 | Tanaka | ................... B33Y 30/00 |
| 2018/0222124 | A1* | 8/2018 | Susnjara | ............... B29C 64/245 |

FOREIGN PATENT DOCUMENTS

| CN | 104669608 A | 6/2015 |
| GB | 2502116 A | 11/2013 |
| WO | 2019193369 A2 | 10/2019 |

OTHER PUBLICATIONS

Molitch-Hou, M., Autodesk Project Escher Finds First Commercial Release in Cronus; engineering.com; Jan. 20, 2017; https://www.engineering.com/3DPrinting/3DPrintingArticles/ArticleID/14149/Autodesk-Project-Escher-Finds-First-Commercial-Release-in-Cronus.aspx.

* cited by examiner

*Primary Examiner* — Yung-Sheng M Tsui
(74) *Attorney, Agent, or Firm* — Adler Pollock & Sheehan P.C.

(57) ABSTRACT

A high speed multi-directional 3D printer includes two opposing delta 3D printers set in an opposing configuration, a modified frame to enable both delta 3D printers to slide back and forth, two horizontal/outward printing extruders, and a sliding/locking kernel substrate mount with adhesive for printing against gravity.

11 Claims, 3 Drawing Sheets

HIGH SPEED MULTI-DIRECTIONAL THREE DIMENSIONAL PRINTER

CROSS REFERENCE TO RELATED APPLICATIONS

This application claims benefit from U.S. Provisional Patent Application Ser. No. 62/896,993, filed Sep. 6, 2019, which is incorporated by reference in its entirety.

STATEMENT REGARDING GOVERNMENT INTEREST

None.

BACKGROUND OF THE INVENTION

The present invention relates generally to printers, and particularly to a high speed multi-directional three dimensional printer.

In general, three dimensional (3D) printing (or additive manufacturing) is a process of making three dimensional solid objects from a digital file. The creation of a 3D printed object is achieved using additive processes. In an additive process an object is created by laying down successive layers of material until the object is created. Each of these layers can be seen as a thinly sliced horizontal cross-section of the eventual object. 3D printing enables a production of complex shapes using less material than traditional manufacturing methods.

SUMMARY OF THE INVENTION

The following presents a simplified summary of the innovation in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

In general, in one aspect, the invention features a high speed multi-directional 3D printer including two opposing delta 3D printers set in an opposing configuration, a modified frame to enable both delta 3D printers to slide back and forth, two horizontal/outward printing extruders, and a sliding/locking kernel substrate mount with adhesive for printing against gravity.

In another aspect, the invention features a high speed multi-directional 3D printer including two opposing delta 3D printers set in an opposing configuration, a modified frame to enable both delta 3D printers to slide back and forth, two horizontal/outward printing extruders, a sliding/locking kernel substrate mount with adhesive for printing against gravity, an external micro-controller, and an external liquid crystal display (LCD) screen.

Embodiments of the invention may include one or more of the following advantages.

The high speed multi-directional 3D printer of the present invention can be scaled up with more print heads to make 3D print times a fraction of what they are in the present day.

Printing horizontally, rather than vertically, enables 3D printing in multiple directions.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

These and other features, aspects, and advantages of the present invention will become better understood with reference to the following description, appended claims, and accompanying drawings where:

DETAILED DESCRIPTION

Figure 1:
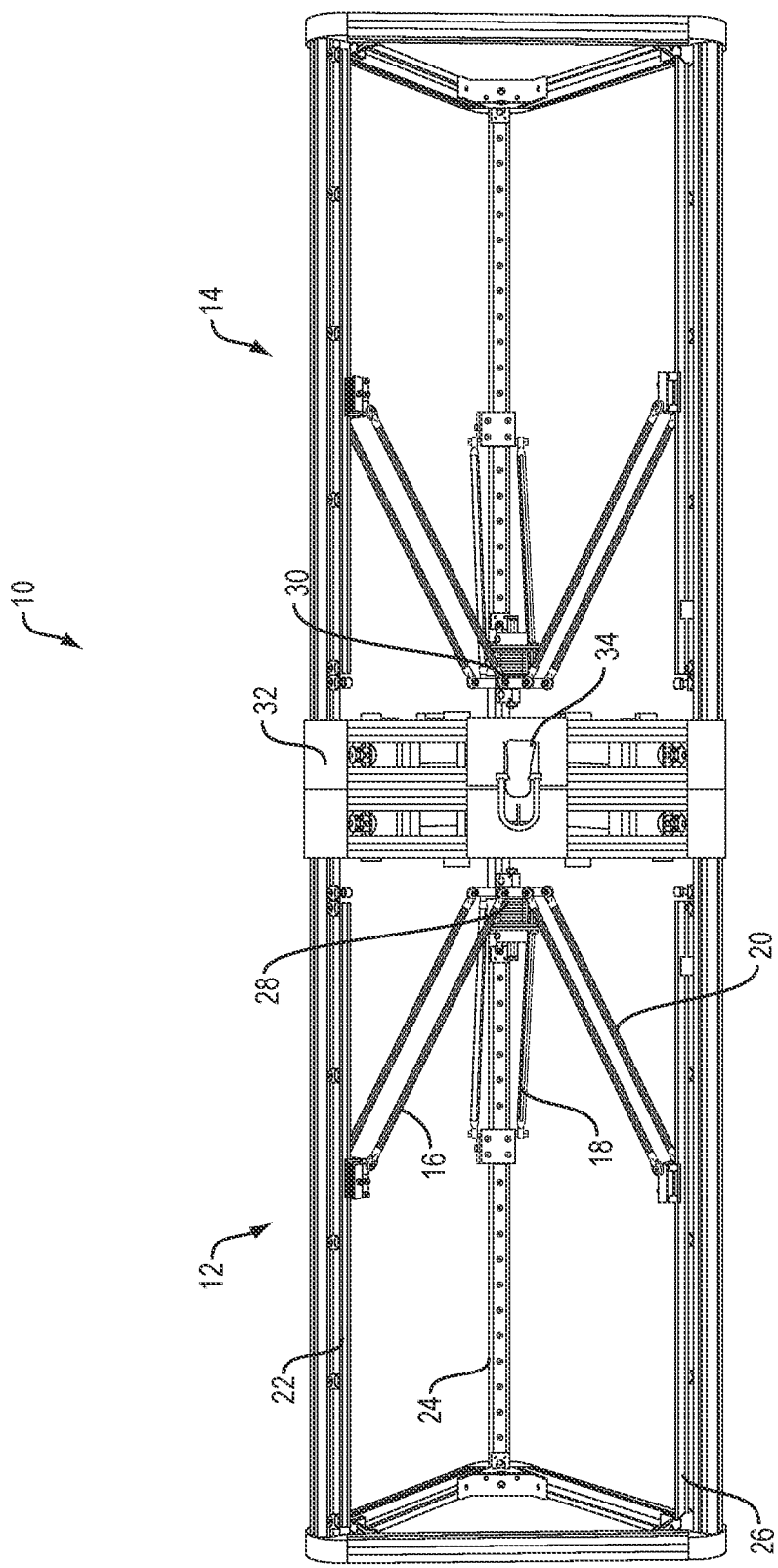
FIGS. 1-4 illustrate an exemplary high speed multi-directional three dimensional (3D) printer.
Figure 2:
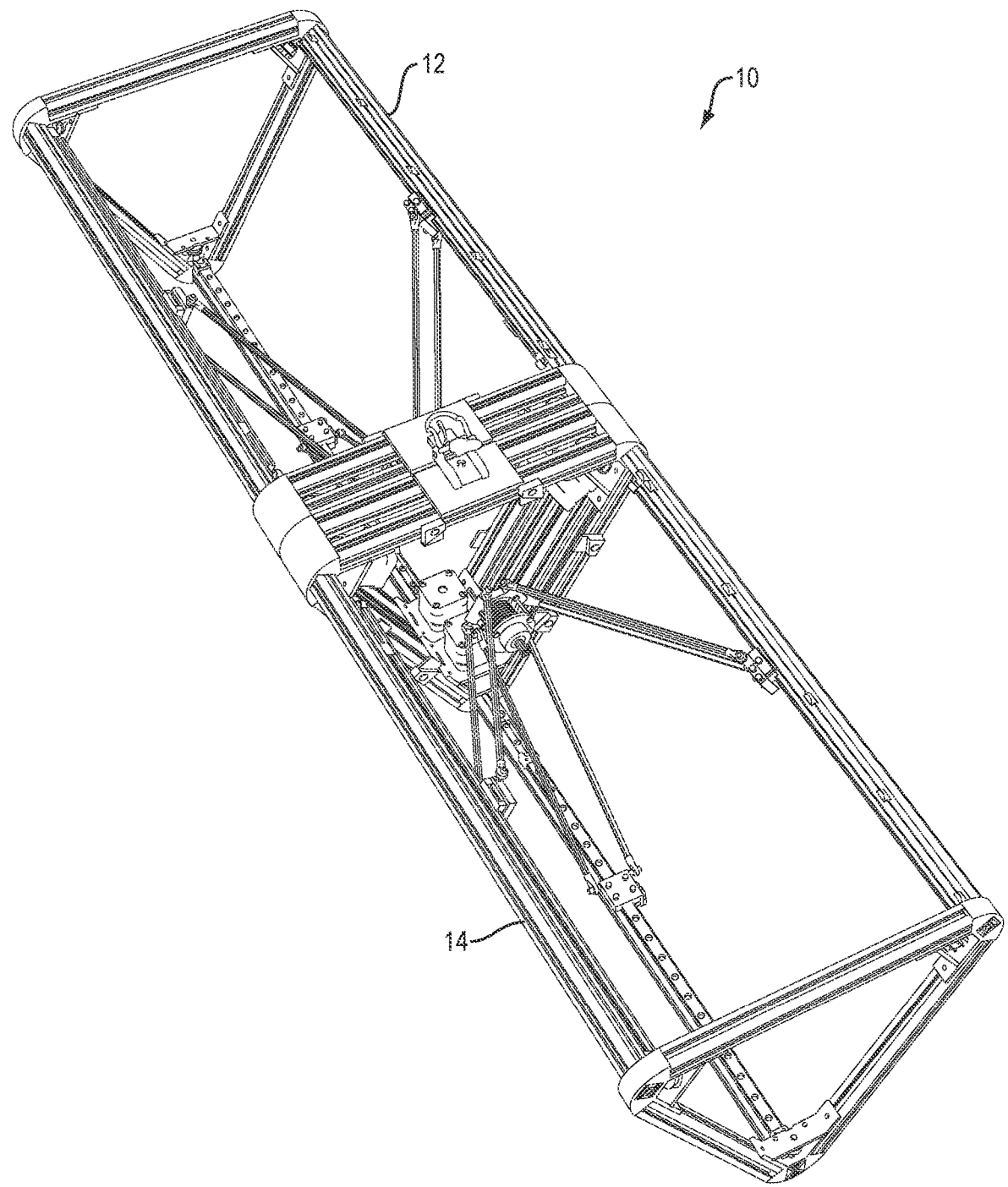

The subject innovation is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

Rapid prototyping is not rapid. It can take hours to print three dimensional (3D) objects. The present invention reduces print times significantly and is referred to herein as high speed multidirectional 3D printing.

The high speed multidirectional 3D printer disclosed herein prints outward, rather than upward, to reduce print times dramatically. More specifically, the high speed multidirectional 3D printer prints horizontally, rather than vertically, enabling printing in multiple directions. This is accomplished by developing a surface to print off of.

Referring now to FIGS. 1-4, an exemplary high speed multi-directional 3D printer 10 is illustrated. The high speed multi-directional 3D printer 10 is built off of two opposing delta 3D printers 12, 14. Each delta 3D printer, delta 3D printer 12 for example, includes three arms 16, 18, 20 on rails 22, 24, 26 that move up and down independently to move a print head. The three arms 16, 18, 20 give it its distinct triangular frame. Delta 3D printers typically have a stationary circular print bed. Delta 3D printers are thin and long, making them suitable for printing tall and narrow models. Delta 3D printers use trigonometric functions based on the angles that these arms create to determine a precise location of a print head within a 3D print space. The circular print bed gives them a more efficient use of the printing space, especially when printing circular prints. Delta 3D print heads are built to be as light as possible, which results in a quicker printing process.

The high speed multi-directional 3D printer 10 also includes two horizontal/outward printing extruders 28, 30 and a sliding/locking kernel substrate mount 32, with adhesive for printing against gravity.

When the high speed multi-directional 3D printer 10 is built off of the two opposing delta 3D printers 12, 14, several additional elements are added. The first is their configuration, which is horizontal, rather than vertical. Second, the two opposing delta 3D printers 12, 14 are set in an opposing configuration (typically only one printer, standing upright is used). The build plate is removed, and the wires and motors are reconfigured to enable an "open up" a space in the "bottom." The printer heads are recalibrated to print below this surface, so that they can touch each other.

The frame of the high speed multi-directional 3D printer 10 modified by using double length 80/20 members to enable both delta 3D printers 12, 14 to slide back and forth. This enables a space in between which can hold, for example, a cardboard substrate. By sliding both ends together, it holds the cardboard substrate in place at a "zero point." A locking mechanism 34 is added to hold it all in place.

A micro-controller, a LCD screen, and other elements (not shown) are placed outside of the structure, giving the whole length of the high speed multi-directional 3D printer 10 more space to print in both directions.

Additionally, we developed a different approach to using an STL file part, by slicing it in half, and sending the G-code of each half to each delta 3D printer 12, 14. More specifically, we split the .STL part (e.g., in Rhino, an open-source implementation of JavaScript™), and use Repetier-Host to transfer the g-code to each printer delta 3D printer 12, 14. The Repetier-Host program is included with the 3D print head attachment and is used in conjunction with a slicing software that is built into it to prepare 3D models for printing; Repetier-Host loads a model into a graphical work space.

In one implementation, this operation is combined into a single program that slices the .STL part and sends each section to each delta 3D printer 12, 14.

Figure 3:
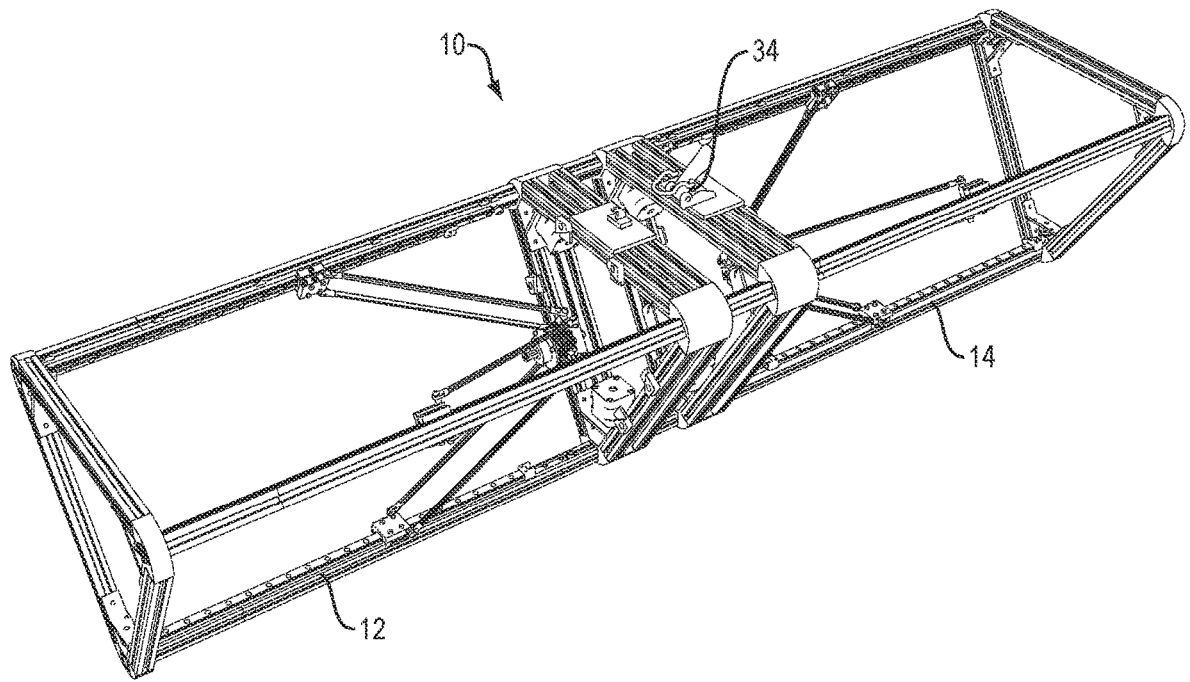
Figure 4:
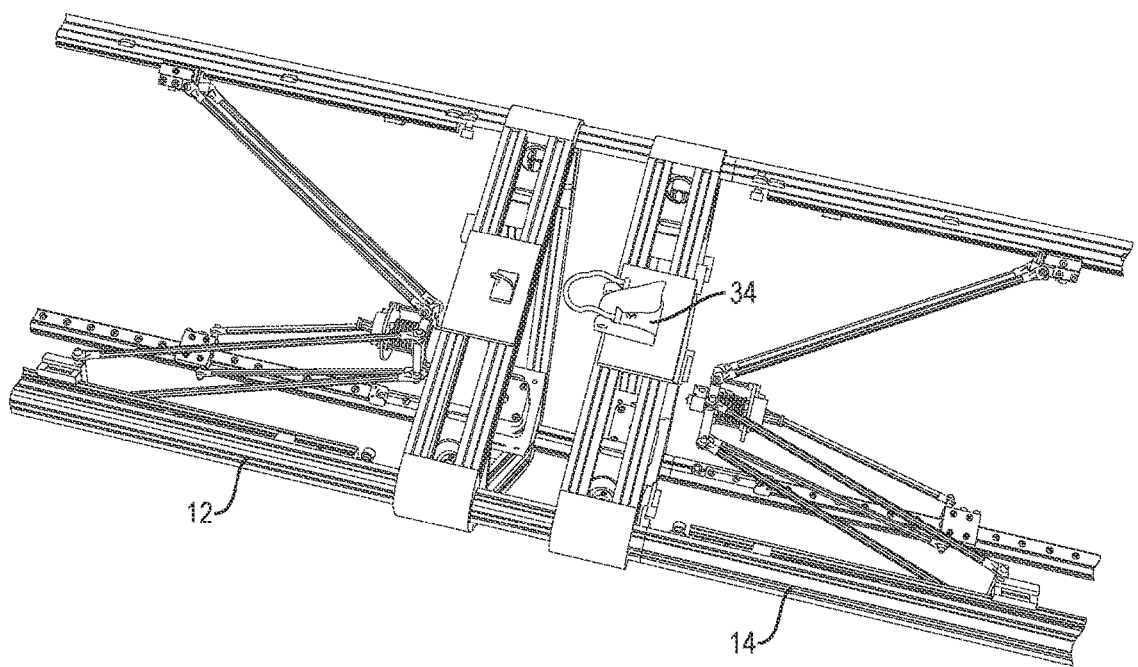

FIGS. 3 and 4 illustrate the lock 34 open.

It would be appreciated by those skilled in the art that various changes and modifications can be made to the illustrated embodiments without departing from the spirit of the present invention. All such modifications and changes are intended to be within the scope of the present invention except as limited by the scope of the appended claims.

What is claimed is:

1. A high speed multi-directional 3D printer comprising:
   two opposing delta 3D printers set in an opposing configuration along a horizontal axis, each delta 3D printer comprising an extruder;
   a frame configured to enable both delta 3D printers to slide back and forth along the horizontal axis; and
   a triangular locking substrate mount comprising adhesive configured for printing on a vertical plane against gravity.

2. The high speed multi-directional 3D printer of claim 1 wherein the frame comprises T-slot rails.

3. The high speed multi-directional 3D printer of claim 2 further comprising an external micro-controller.

4. The high speed multi-directional 3D printer of claim 3 further comprising an external liquid crystal display (LCD) screen.

5. The high speed multi-directional 3D printer of claim 1 wherein each one of the two opposing delta 3D printers comprises three arms on three rails that move up and down independently to move a print head.

6. The high speed multi-directional 3D printer of claim 5 wherein each one of the two opposing delta 3D printers further comprises a stationary circular print bed.

7. A high speed multi-directional 3D printer comprising:
   two opposing delta 3D printers set in an opposing configuration along a horizontal axis, each delta 3D printer comprising an extruder;
   a frame configured to enable both delta 3D printers to slide back and forth along the horizontal axis;
   a triangular locking substrate mount comprising adhesive configured for printing on a vertical plane against gravity;
   an external micro-controller; and
   an external liquid crystal display (LCD) screen.

8. The high speed multi-directional 3D printer of claim 7 wherein each one of the two opposing delta 3D printers comprises three arms on three rails that move up and down independently to move a print head.

9. The high speed multi-directional 3D printer of claim 8 wherein each one of the two opposing delta 3D printers further comprises a stationary circular print bed.

10. The high speed multi-directional 3D printer of claim 9 wherein the two opposing delta 3D printers are controlled by using a STL file part.

11. The high speed multi-directional 3D printer of claim 10 wherein the STL file part is sliced in half and G-code of each half of the STL file part is sent to each of the two opposing delta 3D printers.

* * * * *